United States Patent [19]

Hayashi et al.

[11] Patent Number: 4,975,750

[45] Date of Patent: Dec. 4, 1990

[54] SEMICONDUCTOR DEVICE

[75] Inventors: Yutaka Hayashi; Eiichi Suzuki, both of Ibaraki, Japan

[73] Assignee: Agency of Industrial Science & Technology, Ministry of International Trade & Industry, Tokyo, Japan

[21] Appl. No.: 60,866

[22] Filed: Jun. 12, 1987

Related U.S. Application Data

[62] Division of Ser. No. 766,891, Aug. 16, 1985.

[30] Foreign Application Priority Data

Oct. 28, 1977 [JP] Japan ................................ 52-128787

[51] Int. Cl.⁵ ..................... H01L 49/02; H01L 29/88; H01L 29/72
[52] U.S. Cl. .......................................... 357/6; 357/12; 357/34
[58] Field of Search ............................ 357/12, 34, 4.6

[56] References Cited

U.S. PATENT DOCUMENTS

3,569,799  3/1971  Fang et al. ........................ 357/6

Primary Examiner—Rolf Hille
Assistant Examiner—Fetsum Abraham
Attorney, Agent, or Firm—Oblon, Spivak, McClelland, Maier & Neustadt

[57] ABSTRACT

A semiconductor device having a sandwich construction formed by causing a semiconductor region and an opposed region to face each other across a thin film which is made of a substance having a wider forbidden band gap than that of the semiconductor region and having a barrier relative to the semiconductor region. The so-formed device exhibits various effects such as amplification, negative resistance, switching, voltage or current generation, photo-electric conversion, and light-emission either upon irradiation with light or upon application of a power source thereon.

1 Claim, 5 Drawing Sheets

FIG_4(A)

FIG_4(B)

FIG_6

FIG_7

FIG_8(A)

FIG_8(B)

FIG_8(C)

FIG_9

FIG_10

1

SEMICONDUCTOR DEVICE

REFERENCE OF COPENDING APPLICATION

This application is a divisional application of our copending application Ser. No. 766,891 filed Aug. 16, 1985.

BACKGROUND OF THE INVENTION

This invention relates to a semiconductor device having a bi-polar transistor structure which serves functions of photo-electric conversion, amplification, switching, memory, oscillation, negative resistance and electric current or voltage generation, for example, and is adapted for high integration, and more particularly, to a semiconductor device comprising a semiconductor region, an opposed region and a thin film which is interposed between the semiconductor region and the opposed region and has a wider forbidden band gap than that of the semiconductor region so as to form an electronic barrier at the interface between itself and the semiconductor region and a thickness small enough for the carriers to be transported by direct tunneling, Fowler-Nordheim tunneling, trap-assisted tunneling or the like (the various conduction mechanisms mentioned will be collectively referred to hereinafter as "tunneling" for simplicity of description) so as to permit the carriers to be injected from the opposed region across the thin film into the semiconductor region and through a depletion or inversion layer formed in the surface portion of the aforesaid semiconductor region and to reach the semiconductor region and/or form electron-hole pairs in the semiconductor region around the surface thereof.

Generally in the p-n junction type semiconductor devices, efficient injection of the carriers from one to the other region is not obtained unless each of the semiconductor regions forming the junction is made of a single crystal not appreciably abounding with defects or traps and the impurity density in the region accepting the carriers is lower by at least one order of magnitude than that in the other region. For this reason, in the design of semiconductor devices, the parasitic resistance and capacitance of devices have been restricted to a point where optimum design is hardly feasible.

SUMMARY OF THE INVENTION

An object of the present invention is to provide a semiconductor device which permits efficient injection of carriers from a conductive opposed region to a semiconductor region via a thin film, resulting in formation of electron-hole pairs by the carriers injected slightly inward of the surface of the semiconductor region, or resulting in transportation of the injected carriers through a depletion or inversion layer formed in the surface portion of the semiconductor region, thereby to enable the functions of light emission, photo electric conversion, amplification, switching, memory, oscillation, negative resistance and electric current or voltage generation to be efficiently carried out.

Another object of the present invention is to provide a semiconductor device which has a simple structure and consequently a small size and is adapted for high integration.

To accomplish the objects described above according to the present invention, there is provided a semiconductor device which comprises a semiconductor region, an opposed region disposed opposite the semiconductor region mentioned above, a thin single or multiple layer film made of a substance having a wider forbidden band gap than that of the semiconductor region and interposed between the semiconductor region and the opposed region, the thickness of the thin film being small enough for the carriers between the opposed region and the semiconductor region to be transported in the forbidden band at least in a part of the film in the direction of the thickness of the film, and a carrier injection means which is adapted to inject carriers of higher energy than the band gap energy of the semiconductor region to the semiconductor region via the thin film by a tunneling mechanism so as to induce formation of electron-hole pairs slightly inward of the surface of the semiconductor region and/or induce a depletion or inversion layer at the surface of the semiconductor region, or a carrier injection means which is adapted to induce a depletion or inversion layer in the surface portion of the semiconductor region and inject carriers to the semiconductor region.

Since the opposed region made of a metal or some other suitable semiconductive material and the semiconductor region are caused to face each other across the thin semiconductive film or insulating film which possesses a wider forbidden band gap, the impurity concentrations in the two regions need not be contrasted with the strictness required for the conventional junction type transistors. This freedom from the strict contrast proves highly advantageous from the standpoint of the manufacture of semiconductor devices. Owing to the carrier injection from the opposed region into the semiconductor region via the thin film and subsequent electron-hole pair formation which is induced slightly inward of the surface of the semiconductor region by the carriers injected with higher energy than the forbidden band gap of the semiconductor region when the barrier height between the thin film and the semiconductor region is higher than the forbidden band gap of the semiconductor region or, otherwise, owing to transportation of carriers which are supplied from the opposed region and successively transported into the semiconductor region through the depletion or inversion layer at the surface of the semiconductor region, the semiconductor device of the present invention exhibits various functions such as amplification, negative resistance, switching, memory and electric current or voltage generation, photo-electric conversion, light-emission upon irradiation of light or upon application of a power source thereon. Further, the capability for high integration of this invention permits the semiconductor device to be used to realize an excellent memory device, FET or CCD integrated circuit with advantageous characteristics. Since this semiconductor has a small size for an individual element, it is suitable for high integration.

The other objects and characteristic features of the present invention will become apparent from a detailed description to be given hereinafter with reference to the accompanying drawing.

DESCRIPTION OF THE PREFERRED EMBODIMENTS

Figure 1A:
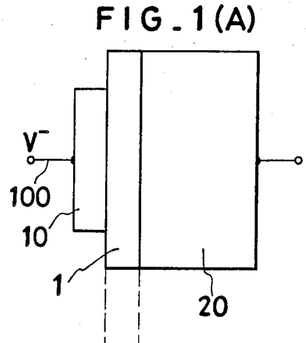
FIGS. 1(A), 1(B) and 1(C) are a schematic sectional diagram, a band diagram and a characteristic diagram, illustrating the principle of a first embodiment of the semiconductor device of the present invention.
Figures 1B, 1C:
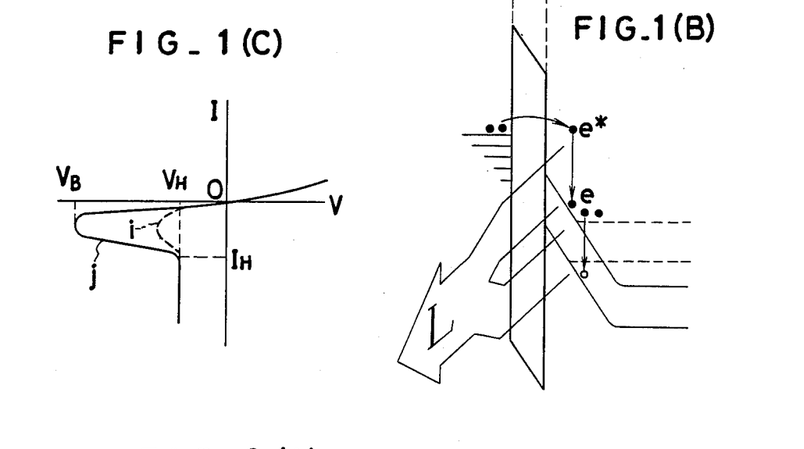

FIG. 1 represents the basic construction of the semiconductor device of the present invention Now, the principle of the semiconductor devices of the present invention will be described with reference to this diagram.

The semiconductor device in this embodiment comprises a semiconductor region 20 having a first surface, a thin film 1 in intimate contact with the first surface of the semiconductor region 20, and an opposed region 10 in intimate contact with the thin film 1 to face the first surface of the semiconductor region 20 via the thin film 1 as shown in FIG. 1(A). The thin film 1 is made of a semiconductive or insulating material having a wider forbidden band gap than that of the semiconductor region 20 and having higher barrier height in relation to the semiconductor region 20 than the forbidden band gap of the semiconductor region when no bias is applied between the opposed region 10 and the semiconductor region 20. The opposed region 10 is formed of a metal or semiconductive material.

Now, the principle of this device will be described by assuming that carriers which are injected from the opposed region 10 by means of a carrier injection means connected to a lead 100 are electrons. In this invention, the carriers from the opposed region 10 are called "main carriers". If the main carriers of the device are holes and the opposed region is a semiconductor, the following explanation on the principle of the semiconductor device will apply correctly thereto on condition that the conductivity type of the two regions indicated is reversed.

Insofar as the thin film 1 has a thickness such that the thin film 1 remains intact and permits flow of the electric current therethrough when the electric potential of the opposed region 10 is higher than the voltage equivalent to the forbidden band gap of the semiconductor region 20, a bias applied to the opposed region 10 with an electric potential greater by at least the voltage equivalent to the aforementioned forbidden band gap than that of the conduction band of the semiconductor region 20 enables the electrons in their unaltered state of high energy (e*) to be injected into the semiconductor region 20 by "tunneling" (as defined hereinbefore), thereby to give rise to electron-hole pairs in the neighborhood of the surface of the semiconductor region 20 with some probability When the semiconductor region 20 is of n-type and a depletion layer is induced in the surface of the semiconductor region under the opposed region, the holes thus formed accumulate in the surface portion of the semiconductor region 20, and cause a reduction in the width of the depletion layer in the surface portion and an increase in the magnitude of the voltage applied to the thin film 1. Thus, the injection of electrons from the opposed region 10 is all the more enhanced to the extent of inducing the "ON" state. As a result, there is obtained the negative resistance of the form of current control as shown in FIG. 1(C). In the diagram of FIG. 1(B), the band indicated in the solid line in the semiconductor region 20 represents the state existing prior to the formation of the electron-hole pairs and the band indicated in the dotted line represents the "ON" state in which the formed positive holes are accumulated in the surface portion so much as to elevate the energy level so that the electric potential required to cause flow of electric current is small. In the "OFF" state, since the majority of carriers in the n-type semiconductor are electrons, there is formed a depletion layer d along the surface portion of the semiconductor region when a negative potential is applied to the opposed region. As the electric potential is further increased in the negative direction, positive holes are induced in the surface portion of the semiconductor region. When the generation of such holes in the surface depletion layer is slight, the holes which are minority carriers in the n-type semiconductor either flow through the thin film 1 and reach the opposed region 10 or undergo recombination with the electrons of the film at the interface between the thin film 1 and the semiconductor region 20. For this reason, the holes induced as minority carriers in the surface portion of the semiconductor region are not allowed to remain in the surface portion. Consequently, the depletion layer formed in the surface portion of the semiconductor region gradually expands in proportion as the electric potential applied to the opposed region is increased in the negative direction. The potential thus applied is consumed in the depletion layer and the electric field across the thin film is small, thereby to cause reduction of current flow resulting in the "OFF" state of the device.

What should be noted is the fact that the formation of electron-hole pairs generated slightly inward of the surface of the semiconductor region in this invention is not due to the avalanche process adopted in various conventional semiconductor devices such as the avalanche photodiode. The avalanche process requires carrier heating in a semiconductor, especially, a depletion layer of a semiconductor p-n junction, and necessitates long distance carrier transport in the semiconductor to obtain threshold energy from an electric field in the semiconductor. However, the electron-hole pair formation in this invention is accomplished by a kind of non-avalanche process. In the non-avalanche process, the electrons injected into the semiconductor region 20 by "tunneling" effect possess higher energy than the forbidden band gap of the semiconductor region, and therefore, long distance carrier transport is unnecessary in the semiconductor region to get energy from the electric field in the semiconductor region.

Now, the experiment depicted in FIG. 1 will be described When a semiconductor device was formed by using a thin metal film of aluminum as the opposed region 10, an insulating film of clean $SiO_2$ with a thickness cf about 30 Å as the thin film 1, and a single Si crystal doped with $10^{17}$ phosphorus atoms per $cm^3$ as the semiconductor region 20, the negative resistance characteristics shown in FIG. 1(C) were such that the breakover voltage $V_B$ was in the range of from $-4$ V to $-5$ V, the sustain voltage $V_H$ in the range of from $-3.1$ V to $-3.2$ V and the sustain current $I_H$ density (sustain current, $I_H$/device area) was about 2 $\mu A/cm_2$. The above mentioned experimental device was switched from its "OFF" state to its "ON" state when the opposed region 10 was biased relative to the semiconductor region 20 with a voltage in the range of from $-3.2$ V to $-4$ V and the light from a light emitting diode or a tungsten valve of about 500 mW was radiated in a pulsated form onto the device. This "ON" state continued to exist after removal of the light irradiation so long as the bias voltage was not shifted from the sustain voltage $V_H$ to the O volt side. That is to say, this device can serve as a photo-switch as well as an electrical switch of a simple construction. In the experiment described above, the switching property indicated in FIG. 1(C) was observed so far as the thickness of the $SiO_2$ film was within 50 Å. Not only the $SiO_2$ film but also a silicon nitride film was used in the experiment. In the case of a silicon nitride film with a thickness of 85 Å, the breakover voltage $V_B$, was in the range of from $-7$ V to $-10$ V, the sustain voltage was about $-4.5$ V and the sustain current was about 50 to 100 $nA/cm^2$.

In order for the semiconductor device to bring about the particular effect mentioned above, the raw materials for the device should be selected so that the barrier of the thin film in relation to the opposed region is low against the main carriers and high against the carriers of the polarity opposite the main carriers in relation to the semiconductor region. When the selection of raw materials is proper, the injection of main carriers from the opposed region to the semiconductor region can be efficiently carried out. Instead of adhering to this rule of raw material selection, the same effect may be obtained by using, in the semiconductor device, either a thin film made of a substance capable of providing desired tunneling to carriers preponderantly of one polarity or an opposed region made of a substance possessing the same polarity as that of the carriers desired to be transported through the thin film.

In this embodiment, the conductive opposed region 10 is formed of a metal or a semiconductor and the thin film 1 is formed of an insulator. This thin film 1 may be formed even of a semiconductor so long as the forbidden band gap of the thin film 1 is wider than that of the semiconductor region 20 and the energy barrier between the semiconductor region and itself is higher than the forbidden band gap of the semiconductor region without applying a bias current between the opposed region 1 and the semiconductor region 20. The aforementioned semiconductor may of course be formed of III-V, II-VI or IV-IV compound semiconductor, or another element.

Development of this new device as mentioned above has enabled realization of a successful memory device with power consumption smaller than pW/bit. As an example of the multiple layer thin film, a double layer comprised of 30 Å to 70 Å of silicon nitride and about 30 Å. of silicon dioxide can successfully be used to obtain the experimental devices of this invention. With the thickness of the thin film 1 used in the experiment described above, the transportation of carriers within the thin film 1 was effected not by direct tunneling but by indirect tunneling such as of Fowler-Nordheim tunneling or by transportation via trap levels within the forbidden band. In case where the semiconductor region 20 is formed of a luminescent substance such as GaAs, GaP or InP, there occurs emission of the light L, when the high energy carriers (e*) are deprived of their energy or when the holes, upon occurrence of electron-hole pairs, undergo recombination and consequent annihilation in the surface portion.

Even with such a non-luminescent substance as Si, the occurrence of electron-hole pairs can confer various active characteristics on the device A typical example of the case will be described with reference to the device of the planar construction shown in FIG. 2(A). When the holes formed in the surface of semiconductor region 20 by the high-energy carriers injected from the opposed region 10 are collected by means of a third region 21 which is formed of p-type semiconductor and disposed within a distance which the above formed holes reach by diffusion or drift, a positive electric potential can be withdrawn from the third region 21 notwithstanding the application of a negative-bias to the opposed region 10. In short, this device can be utilized as a power source of reversed polarity having the characteristics of FIG. 2(B). This utility of this device proves to be advantageous for the purpose of providing a bias of reversed polarity such as in integrated circuits.

Figure 2A:
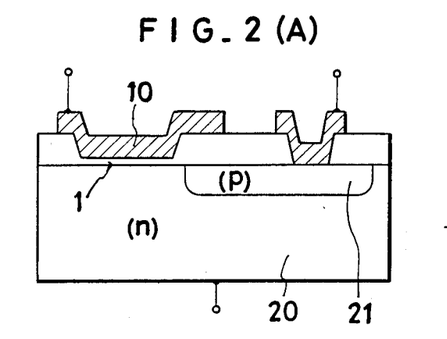
FIGS. 2(A) and 2(B) are an explanatory sectional diagram and a characteristic diagram, illustrating a second embodiment of the present invention.
Figure 2B:
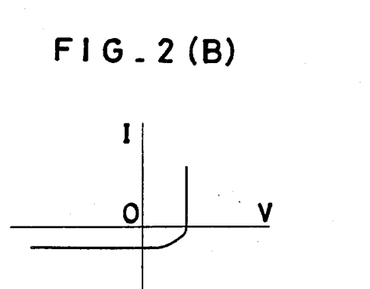
Figure 3A:
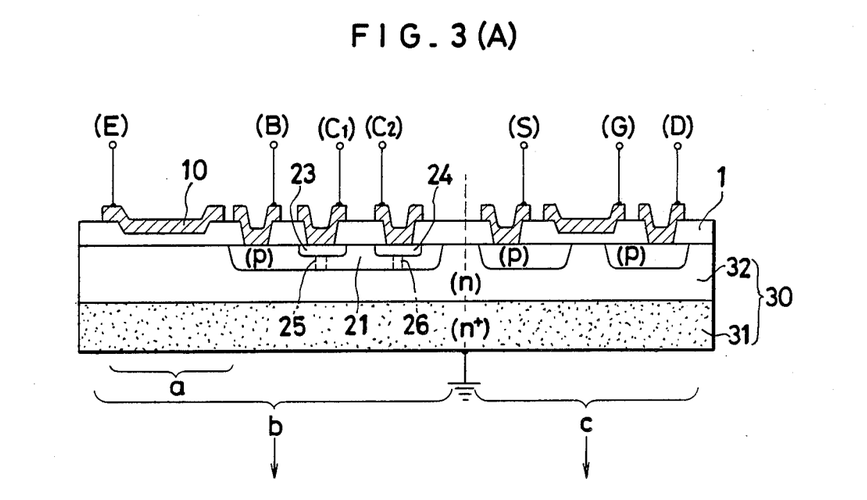
FIGS. 3(A), 3(B) and 3(C) are an explanatory diagram and two equivalent circuit diagrams, illustrating the integrated circuit in a third embodiment of the present invention.

The device of the construction of FIG. 3(A) constitutes one preferred embodiment having the planar construction of FIG. 2(A) applied to the integrated circuit. As is clear from the diagram, a substrate 30 is formed by superposing on an $n^+$-type layer 31 possessing a high n-type impurity concentration, an n-type layer 32 grown as a single crystal layer and possessing a lower impurity concentration and a higher specific resistance than the $n^+$-type layer 31. An npn-type bipolar transistor with multi-collectors $C_1$ and $C_2$ each possessing a common p-type base B is formed in one part and a p-MOS transistor in the other part respectively of the surface of the substrate 30, simultaneously in a series of processing steps. The resulting device can be used for the purpose of realizing a high performance integrated circuit. Basically, a negative power source and a positive power source would be required for the operation of two elements on the same substrate. In the present device, however, use of one power source suffices for their operation because this device a which corresponds to the device of FIG. 2(A) comprising an opposed region 10, a thin film 1 and a semiconductor region 32 plus a region 21 exhibits the property of generating voltage of reverse polarity as shown in FIG. 2(B).

Figure 3B:
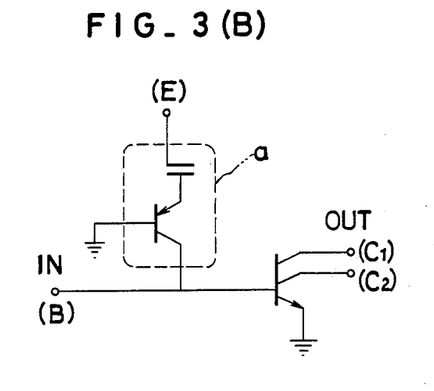

The device a of the present invention may well be regarded as possessing the function of an equivalent pnp-type transistor. In the diagram of FIG. 3(A), the opposed region 10 formed across the thin film 1 from the substrate functions as an emitter E for the equivalent pnp-type transistor, and the p-type semiconductor region 21 serves the purpose of collecting the minority carriers generated in the surface portion of the region 32 by the high-energy carriers which have been tunneled through the thin film 1 from the opposed region 10 (as the emitter for the equivalent pnp-type transistor) and, for this reason, is disposed within a distance which the above formed holes reach by diffusion or drift from the plane of junction between the thin film 1 and the semiconductor region 32. The region 21 is a region of opposite conductivity type relative to the region 32. It is of p-type in the present preferred equipment. The regions 23 and 24 formed within the region 21 are of reversed conductivity type with respect to the region 21. They constitute themselves the multi-collectors $C_1$, $C_2$ for the npn-type transistor. The base B of the npn-type transistor mentioned above is shared with the carrier collection region 21. The emitter for this npn-type transistor is formed by the substrate 30 itself. The equivalent circuit of the pnp-type transistor and equivalent npn-type transistor is illustrated in FIG. 3(B), and it forms an amplification circuit or a logic circuit.

Figure 3C:
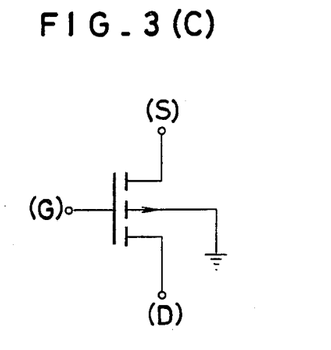

The element c which is formed on the same substrate is an enhancement-type p-channel MOS transistor which operates with a negative bias as shown in a equivalent circuit in FIG. 3(C). The regions of this element form a source S, a gate G and a drain D respectively.

The device of this construction permits high levels of integration because the region for collecting the holes formed by the electrons tunneled from the opposed region 10 with high energy coincides with the base region.

When this device is further provided with channel regions 25, 26 as indicated by the dotted lines in the diagram of FIG. 3(A), it can be operated as a junction-type field-effect transistor (FET) wherein the third region 21 of p-type functions as a gate by using the regions 31, 32 (substrate 30) as the source and the regions 23, 24 as the drain respectively. In this case, the third region 21 need not be of a p-type semiconductor but may be of a substance such as, for example, a metallic substance capable of forming a rectifying junction between itself and the region 32 or of a semiconductive substance capable of forming a hetero-junction with the region 32. All that is needed for the purpose of allowing this integrated circuit to function effectively as a direct-connection type logic circuit is merely selecting the impurity densities and widths of the regions 25, 26 serving as channels so that a depletion layer is formed in the channel to stop drain-source current when no bias is present between the region 21 as the gate and the region 30 (substrate) as the source.

Figure 4A:
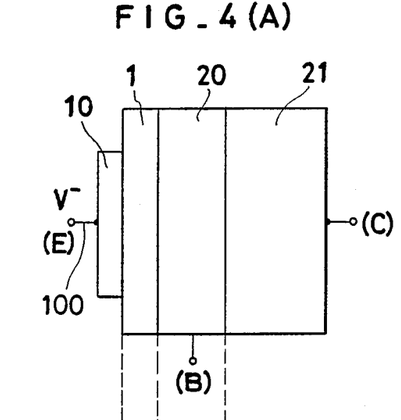
FIGS. 4(A) and 4(B) are an explanatory sectional diagram and a band diagram, illustrating a fourth embodiment of this invention.
Figure 4B:
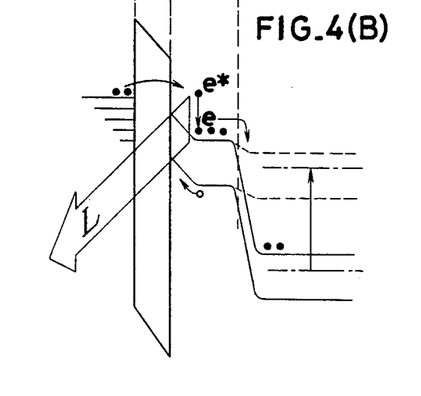

FIG. 4 represents another preferred embodiment of this invention. The device of this construction comprises an opposed region 10, a thin film 1, a semiconductor region 20 of the conductivity type opposite to the main carriers and a region 21 with the same conductivity type as the main carriers allowed to pass through the thin film 1.

The thin film 1 is disposed so as to adjoin the region 20. A sectional view of this construction is shown in FIG. 4(A). The band diagram of this device, drawn by assuming electrons as its main carriers allowed to pass through the thin film 1, is shown in FIG. 4(B). When a bias is applied between the region 21 and the opposed region 10 by means of the carrier injection means connected to the lead 100 and this bias is increased towards a polarity such that the main carriers from the opposed region 10 are passed through the thin film 1 and injected into the semiconductor region 20, the difference of energy level between the opposed region 10 and the conduction band edge of the semiconductor region 20 will increase to exceed the value of the forbidden band gap of the semiconductor region 20. Consequently, the main carriers thus injected induce formation of electron-hole pairs in the neighborhood of the surface of the semiconductor region 20. As a result, part of carriers with the opposite polarity relative to that of the main carriers are accumulated in the surface portion of the semiconductor region 20, and the semiconductor region 20 is charged up with the reverse-polarity carriers so accumulated. Thus, the semiconductor region 20 and the region 21 cooperatively approach the state of 0 bias as illustrated by the dotted lines in FIG. 4(B). Since the electric field of the thin film 1 is consequently intensified, the injection of high-energy carriers is all the more enhanced. If, in this case, the thickness of the semiconductor region 20 intervening between the thin film 1 and the region 21 is smaller than the distance which the main carriers in the thin film 1 can reach by diffusion or drift, the main carriers which have been injected into the semiconductor region 20 (which are minority carriers in the semiconductor region 20) are allowed to reach the region 21. Once the formation of electron-hole pairs is consequently induced, there ensues flow of electric current between the opposed region 10 and the region 21. If no external terminal is provided for the semiconductor region 20, then the device can serve as an element capable of exhibiting current-control type negative resistance or switch characteristic. If the semiconductor region 20 is provided with an external terminal, then the device constitutes itself a bipolar transistor possessing a negative input impedance wherein the region 21 functions as a collector, the region 20 as a base and the opposed region 10 as an emitter, respectively.

Further, in the "ON" state, emission of light from the surface of the semiconductor region 20 is effected when the semiconductor region 20 is made of a light emitting material such as GaAs, $GaAl_{(1-x)}As$, $GaAs_xP_{(1-x)}$ and InP, for example In the case of application of the aforementioned electron-hole pair formation mechanism to the construction of FIG. 2, there can be obtained a negative input impedance transistor possessing a depletion or inversion layer base (formed between the region 20 and the thin film) enjoying still higher speed and permitting direct connection with FET and CCD by eliminating the region 21 from the main operating region in FIG. 2(A). In the device shown in FIG. 2, the region 21 can be used as a control region for r controlling breakover voltage $V_B$ in the current control type switching characteristics between the opposed region 10 and the semiconductor region 20. The region 21 may be formed of materials other than a semiconductor material. In this case, the region 21 is necessary for forming a rectifying junction between itself and the semiconductor region 20.

Figure 5A:
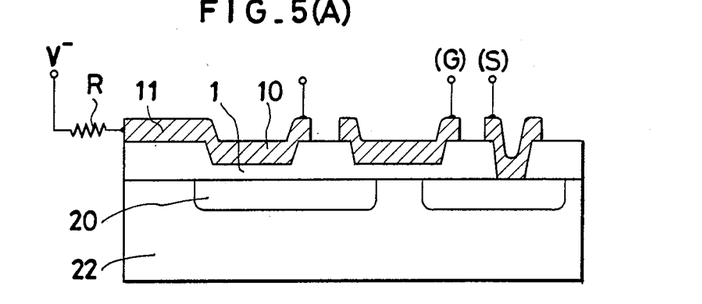
FIGS. 5(A), 5(B) and 5(C) are an explanatory diagram, an equivalent circuit diagram and a characteristic diagram, illustrating the memory cell in a fifth embodiment of this invention.
Figure 5B:
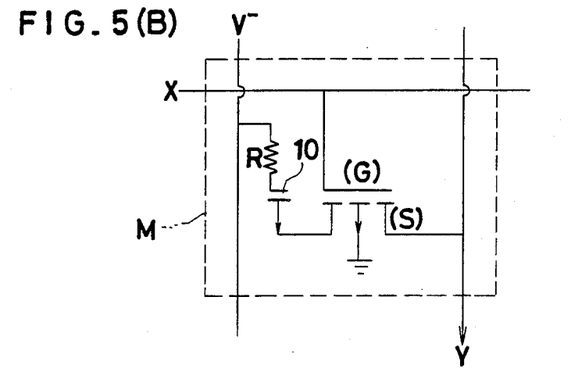
Figure 5C:
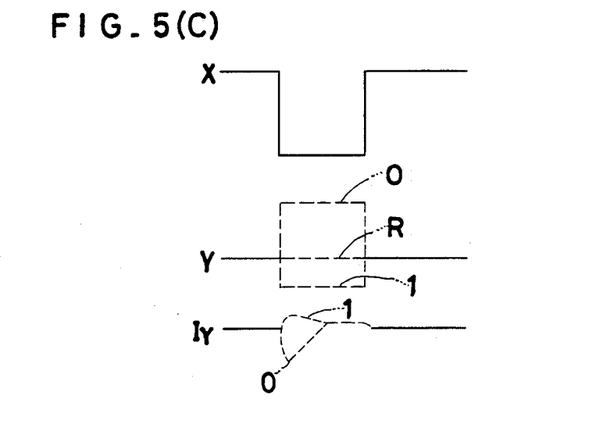

FIG. 5 represents a fifth embodiment which utilizes the element of FIG. 4 as a memory cell M in the integrated circuit. In this diagram, the region 22 is used as a semiconductor substrate and the semiconductor region 20 of opposite conductivity type of the region 22 coincides with the region of drain for the insulating gate field-effect transistor (IGFET). The opposed region 10 is connected via wiring 11 to the resistive element R and the other terminal of the resistive element R is connected to the power source voltage V. The insulating gate G of the IGFET is connected to the selection line X, and the source region S of the IGFET is connected to the data line Y so as to be selected as the XY address of the memory array on the matrix. The operation of this memory cell will be FET is assumed to be a p-channel. In this case, the thin film 1 is made of a SiO$_2$ or silicon nitride film with a tunnelably (inclusive of Fowler-Nordheim tunneling and trap-assisted tunneling) small thickness, or optionally of a composition doped with such an impurity as tungsten to control the conductivity. Although the opposed region 10 may be formed of a thin film of metal, it functions more advantageously when it is made of an n-type semiconductor such as SnO$_2$ which possesses a wider band gap than that of Si.

Figure 6:
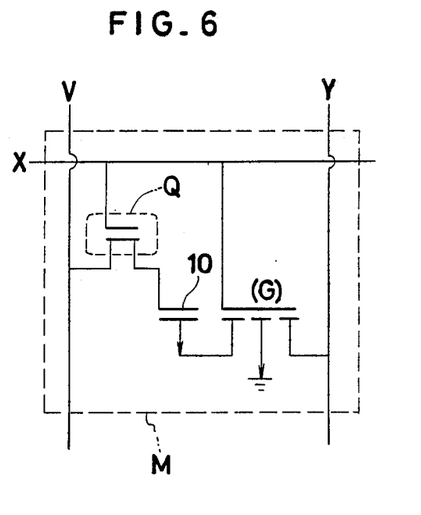
FIG. 6 is an equivalent circuit diagram of a modified memory cell in a sixth embodiment of this invention.

This memory cell M stores given binary coded information (1, 0) in the form of the magnitude of the electric potential of the semiconductor region 20 relative to the substrate 22. To be specific, it stores the value "1" when the electric potential of the region 21 falls on the power source voltage side and the value "0" when the electric potential falls on the substrate voltage side The writing of "0" is accomplished by first exerting a negative voltage upon the gate of the IGFET and then applying to the source a voltage approximating the substrate voltage and thereby causing the region 21 to assume a voltage which approximates the source voltage. In this element, a high electric potential is consequently applied between the opposed region 10 and the semiconductor region 20, to induce the formation of electron-hole pairs due to the main carriers which have been injected from the opposed region 10. Subsequently, high-energy carriers are supplied through the resistive element from the power source. Thus, the written information remains intact in the cell even after the voltage of the gate is returned to the "OFF" level and the semiconductor region 20 is retained at the level of electric potential approximating that of the substrate 22. The writing of "1" is accomplished by exerting an electric potential close to the voltage of power source upon the gate and the source and thereby causing the semiconductor region 20 to assume an electric potential which also approximates the aforementioned potential. Consequently, if the injection of high-energy carriers was in process prior to the writing of "1", this injection is shut off by driving the semiconductor region 20 to an electric potential close to the voltage of the power source. Once the writing is completed, the semiconductor region 20 is retained at the electric potential approximating the power source voltage even after the electric potential of the gate of the IGFET is returned to the "OFF" level. This memory cell obviates the necessity of the refreshing operation required by the conventional dynamic memory, because the leakage current arising from the reverse bias between the semiconductor region 20 and 22 is provided through the thin film 1 via the resistive element R from the power source. Since the area occupied by one memory cell is nearly equal to that for one conventional transistor, the memory cell of this invention permits formation of a high-density static memory. Usually for the purpose of minimizing power consumption during standby, there is used a resistive element R capable of equivalently high resistance (or a micro-current element which exhibits a constant current characteristic). In high-speed readout, since an electric current of relatively high magnitude must be withdrawn, there ensues the so-called destructive read. Inevitably, therefore, the cycle time is elongated. A possible means for avoiding this trouble is the insertion of IGFET Q in serial connection between the opposed region 10 and the power source as shown in FIG. 6. The resistive element R has been integrated in a small area such as with a thin film of polycrystalline Si formed on an insulating film. In this case, it is required to provide an area to be occupied by two transistors per unit cell. At the time of the readout, however, nondestructive readout can be obtained by applying a bias to the gate of IGFET Q in the direction of lower resistance. Thus, high-speed operation can be realized. If there is formed a bipolar transistor which has the region 21 of the construction of FIG. 5 as a collector, there can be materialized a memory cell which has the bipolar transistor functioning as a selection element. There can also be provided a high-density memory cell by using the region 21 concurrently with the drain or source of a field-effect transistor or with the collector of a bipolar transistor.

Furthermore, there can be materialized a functional device by allowing one electrode or a multiplicity of closely juxtaposed and yet mutually insulated electrodes on or in an insulating film 2 on the first surface of the semiconductor region 20 and a third region 25 possessing a rectifying junction with the semiconductor region to be disposed adjacently to an element comprising an opposed region 10, a thin film 1 and a semiconductor region 20 and by utilizing the CCD operation and the series MOS transistor operation. The device of the construction of FIG. 7, for example, produces a function as described below. Firstly, the device functions as the unit cell of a memory array having the third region 25 serving as a write/readout line and one or more insulated gates serving as an address selection line. Secondly, by actuating the insulated gates 41$a$, 41$b$ . . . 41$n$ with properly phased pulses and thereby producing the CCD operation, transmitted signals can be stored without any refreshing operation in the device portion of this invention which is formed of an opposed region 10, a thin film 1 and a semiconductor region 20. Thirdly, by feeding signal charges into the device portion of the present invention by virtue of the aforementioned CCD operation, the number of signal charges can be counted or the frequency of the drive pulses can be divided by utilizing the fact that the device of this invention assumes the "ON" state when the electric charges have been accumulated to a given level. Thus, various useful functions can be materialized.

In the devices as described above according to this invention, novel device actions such as a current controlled negative resistance, switching characteristics, light emission, photo-electric conversion, and current or voltage generation can be accomplished by formation of electron-hole pairs generated slightly inward of the surface of the semiconductor region by carriers which are injected from the opposed region to the semiconductor region via the thin film by tunneling with higher energy than the band gap energy of the semiconductor region.

According to this invention, even when no electron-hole pair is formed, useful device actions can be expected in association with the behavior of a depletion or inversion layer formed in the surface portion of the semiconductor region beneath the opposed region.

Figure 8A:
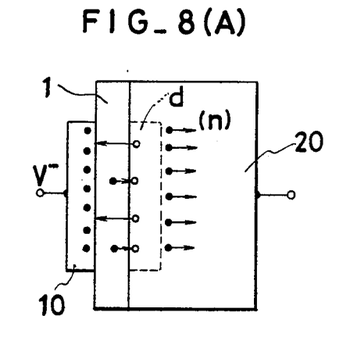
FIGS. 8(A), 8(B) and 8(C) are explanatory diagrams and a band diagram, illustrating the principle of an eighth embodiment of the semiconductor device of the present invention, respectively in the status assumed during normal bias and the status during irradiation with light.
Figure 8B:
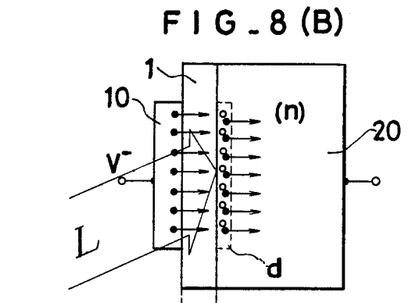
Figure 8C:
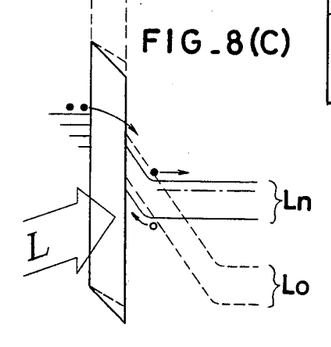
Figure 9:
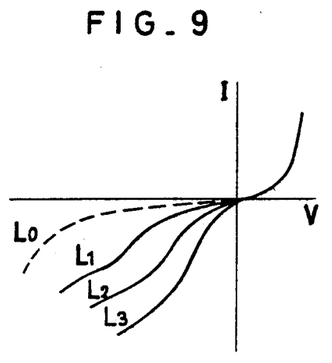
FIG. 9 is an electric current-voltage characteristic diagram representing the effect obtained from the device of FIG. 8 by the irradiation with light.

FIG. 8 illustrates an eighth embodiment of this invention. When the semiconductor region is of n-type, there occurs the following phenomenon. Since the majority carriers in the n-type semiconductor are electrons, there is formed a depletion layer d along the surface portion of the semiconductor region when a negative potential is applied to the opposed region similarly to the aforementioned device. As the electric potential is further increased in the negative direction, positive holes are induced in the surface portion of the semiconductor region. When the generation of such holes in the surface depletion layer is slight, the holes which are minority carriers in the n-type semiconductor either flow through the thin film 1 and reach the opposed region 10 or undergo recombination with the electrons of the film at the interface between the thin film 1 and the semiconductor region 20. For this reason, the holes induced as minority carriers in the surface portion of the semiconductor region are not allowed to remain in the surface portion. Consequently, the depletion layer formed in the surface portion of the semiconductor region gradually expands in proportion as the electric potential applied to the opposed region is increased on the negative direction (FIG. 8(A)). When the surface of the semiconductor region 20 is irradiated with the light L, there are generated electron-hole pairs proportionately to the magnitude of photon absorbed. The electron-hole pairs are split by the electric field in the depletion layer and only the electrons are allowed to flow in the direction of positive potential and the holes partly remain in the surface portion of the semiconductor region to cause a decrease in the depletion layer width. In consequence of the shrinkage of the depletion layer width, the electric field applied to the thin film 1 gains in magnitude, causing the electrons of the opposed region 10 to be passed through the thin film 1 and injected into the semiconductor region 20 by the phenomenon of tunneling. Generally, the electric field-current characteristic of the thin film 1 more often than not shows an exponential function. In the scope of operation under discussion, therefore, a slight change in the electric field brings about a large change in the current. Consequently, there is obtained a change of current of the nature involving an amplification characteristic in which the equivalent quantum efficiency (current increase ratio with respect to photon increase ratio) is more than one as shown in FIG. 9. In the band diagram of FIG. 8(C), the band $L_O$ represents the state in which the depletion layer is expanded without the irradiation with light and the band $L_n$ the state in which the depletion layer is narrowed during the irradiation with light. The current-voltage change caused by the increase in the intensity of light irradiated is shown in FIG. 9. In the graph, the curve $L_O$ represents the characteristic in the absence of light irradiation. The characteristic is gradually shifted to curves $L_1$, $L_2$ and $L_3$ in proportion as the intensity of light irradiated is increased.

For efficient withdrawal of light from or efficient irradiation of light upon the opposed region 10 in the light emitting device or photoelectric device described above, the opposed region is desired to be made of a material such as, for example, a semiconductive substance possessing a wider forbidden band gap than that of the semiconductor region 20, a metallic substance having a film thickness of not more than several hundred angstroms or an opaque substance provided with a multiplicity of slits to permit high transmission of light. It has been ascertained that the photo-electric device according to the present invention is capable of amply functioning with the light received through the peripheral portion of the opposed region even if the opposed region is opaque.

Figure 7:
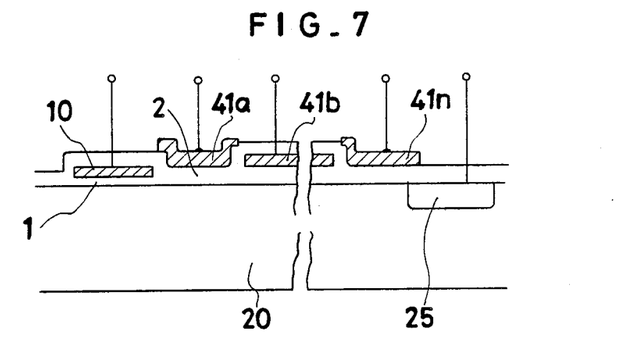
FIG. 7 is an explanatory sectional diagram of the CCD or memory of a seventh embodiment of the present invention.
Figure 10:
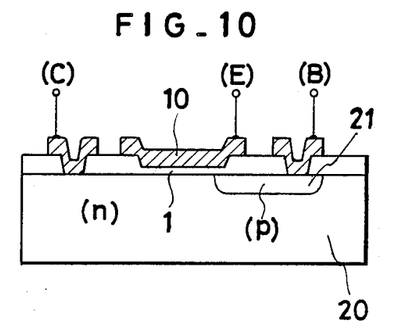
FIG. 10 is a sectional diagram illustrating a ninth embodiment of the semiconductor device of this invention.

Furthermore, a new bipolar transistor (induced base transistor) provided with a base contact can be obtained with a planar construction shown in FIG. 10 which is formed by a further third region adapted to serve as a base contact region. In this construction, the thin film 1 is disposed on the surface of the n-type semiconductor region 20 and the depletion or inversion layer induced on the surface of the n-type region serves as the base. For the purpose of controlling the electric potential of this depletion or inversion layer, a third layer 21 (in this example, a p-type semiconductor region 21) is disposed on or in the surface of the n-type semiconductor region 20 at a distance from the depletion or inversion layer sufficiently small to allow the carriers in the depletion or inversion layer to reach by diffusion or drift. Here, the p-type semiconductor region 21 is used as a region having electrical connection with the induced base. The opposed region 10, the base contact region 21 and the n-type semiconductor region 20 are connected such as through the medium of electrodes to the emitter terminal E, the base terminal B and the collector terminal C respectively. This device is characterized by the fact that the thickness of the inversion layer is so small, ranging around several hundred angstroms, as to even further enhance the high speed of action attainable by the conventional bipolar transistor and, furthermore, the base region, owing to its being an inversion layer in nature, readily permits the direct connection of the device to such other elements as MOS transistors and CCD's, as shown in FIG. 7.

In the above example, the third region can be of a material other than a semiconductor material and is required to make a rectifying junction in conjunction with the semiconductor region. The thin film 1 can be formed not only of insulator but also of a semiconductor, so long as the forbidden band gap of the thin film 1 is wider than that of the semiconductor region 20. For instance, the thin film 1 may be formed of $Ga_xAl_{(1-x)}$. As when the semiconductor region 20 is of GaAs. Otherwise, the thin film 1 can be formed of $In_xGa_{(1-x)}As_yP_{(1-y)}$ in case of the semiconductor region 20 of InP.

The foregoing preferred embodiments have been described as involving electrons as their main carriers In case where such preferred embodiments have positive holes as their main carriers, the operating principles described hereinabove apply with the mere modification of interchanging p's and n's of respective semiconductor regions and reversing the polarities of bias. The thin film of this invention can be either of a single layer or of multiple layers.

In the design of crystalographic perfectness and impurity concentration not only for the opposed region but also for the semiconductor region which constitutes one of the essential components, the construction of the present invention permits materialization of ideal device characteristics to be selected from a decisively broader scope of characteristics than has heretofore been attainable. Among others, the present invention materializes luminescent devices, photo-electric conversion devices, switching devices, current or voltage sources of novel characteristics, a negative base resistance transistor, a novel induced base transistor, switch elements sharing common regions with the conventional devices and permitting formation of high-density IC's, high-speed bipolar transistors possessing low base resistance and other devices and integrated circuits of unique performances.

What is claimed is:
1. A semiconductor device comprising:
a semiconductor region of a first conductivity type having a first surface, an opposed region disposed to face the first surface of said semiconductor region, a thin film interposed between said semiconductor region and said opposed region, made of a substance having a forbidden band gap wider than that of said semiconductor region and a barrier relative to said semiconductor region, said thin film having a thickness permitting carriers to flow therethrough by tunneling, means for creating an electrically induced inversion layer kept by said barrier of the interposed thin film in the first surface of said semiconductor region at a position facing said opposed region, a carrier injection means for injecting carriers of said first conductivity type from said opposed region to said inversion layer in the semiconductor region through said thin film by tunneling, and a third region of opposite conductivity formed in the surface of said semiconductor region forming a rectifying junction in conjunction with said semiconductor region, said region of opposite conductivity being in electrical contact with said inversion layer, said opposed region, said inversion layer, said region of opposite conductivity and said semiconductor region being used as an emitter, an induced base, a base contact and a collector of bipolar transmission, respectively.

* * * * *